US 6,891,955 B1

(12) United States Patent
Bowden et al.

(10) Patent No.: US 6,891,955 B1
(45) Date of Patent: May 10, 2005

(54) AUDIO VOLUME CONTROL FOR COMPUTER SYSTEMS

(75) Inventors: Clifford S. Bowden, Nampa, ID (US); Coe F. Miles, Houston, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/363,788

(22) Filed: Jul. 29, 1999

(51) Int. Cl.[7] ............................................. H03G 11/00
(52) U.S. Cl. ....................................................... 381/104
(58) Field of Search ................................ 381/104, 107, 381/109; 704/270, 272

(56) References Cited

U.S. PATENT DOCUMENTS

| | | | | | |
|---|---|---|---|---|---|
| 4,962,545 A | * | 10/1990 | Klaczak et al. | ............. | 381/107 |
| 5,054,076 A | | 10/1991 | Lowell | | |
| 5,189,705 A | * | 2/1993 | Lavaud | ....................... | 381/104 |
| 5,231,310 A | * | 7/1993 | Oh | .............................. | 307/142 |
| 5,535,409 A | * | 7/1996 | Larvoire et al. | ............ | 713/202 |
| 5,771,301 A | * | 6/1998 | Fuller et al. | ................ | 381/107 |
| 5,796,852 A | * | 8/1998 | Yamaguchi | .................. | 381/104 |
| 5,870,705 A | * | 2/1999 | McAuliffe et al. | .......... | 381/107 |
| 5,963,652 A | * | 10/1999 | Tran et al. | .................. | 381/109 |
| 6,009,181 A | * | 12/1999 | Kim | ........................... | 381/109 |
| 6,122,701 A | * | 9/2000 | Kunkel | ...................... | 381/104 |
| 6,498,855 B1 | * | 12/2002 | Kokkosoulis et al. | ....... | 381/106 |

* cited by examiner

*Primary Examiner*—Forester W. Isen
*Assistant Examiner*—Daniel Swerdlow
(74) *Attorney, Agent, or Firm*—Trop, Pruner & Hu, P.C.

(57) ABSTRACT

A computer system includes an audio chip to generate audio signals at a target volume level to be emitted as audio output by speakers. Also included in the computer system may be a volume control routine to limit the overall volume level of the system. A maximum volume level may be set by a user through interacting with a software routine. The software routine may include password protection, requiring a user to enter a correct password in order to modify the maximum volume level. If the target volume level is above the maximum volume level, then the volume control routine may set the overall volume level of the system at the maximum volume level. Otherwise the volume control routine may set the overall volume level at the target volume level.

10 Claims, 2 Drawing Sheets

AUDIO VOLUME CONTROL FOR COMPUTER SYSTEMS

BACKGROUND

The invention relates generally to computer systems and more particularly to audio features of computer systems.

Audio features are swiftly becoming important in computer systems. Many computers have a compact disk (CD) player capable of playing musical CD's or computer video games. Also, recent innovations in video technology have resulted in the advent of digital video disks (DVD's) that may store large amounts of video data including full length motion pictures. DVD players are now being included in some computer systems. Additionally, computer video games are a popular use for computer systems. Each of these technologies utilize the audio features of computer systems. While the audio output of computer video games and CD's, etc. may be interesting and desirable to some computer users, others may not be quite as fond of the array of audio output generated by computers. In fact, computer system audio output may disturb others in the vicinity. For example, parents may be irritated by loud sounds generated by video games being played by their children on a computer.

Prior art audio systems include physical locks on speakers in an attempt to alleviate the previously mentioned problems. In these prior art systems, a key may be inserted into a lock on a speaker to change the volume level of the speaker. Unfortunately, the prior art audio systems require a physical lock having both mechanical and electronic parts to be included in a speaker. Additionally, the locking mechanism sets the volume at a certain level and does not allow the level to be raised or lowered without using a physical key. Thus, it would be beneficial to provide an alternative technique to limit the audio volume of computer systems.

SUMMARY

In one embodiment, the invention provides a method to limit an audio volume level of a computer system. The method includes obtaining a maximum volume level and receiving a signal having a target volume level. If the target volume is greater than the maximum volume level, then the audio volume level is set at the maximum volume level. Otherwise, the audio volume level is set at the target volume level. In another embodiment, a program storage device includes instructions to obtain a maximum volume level and receive a signal indicating a target volume level. The instructions may also cause a programmable device controller to set an audio volume level at the maximum volume level if the target volume level exceeds the maximum volume level. Otherwise, the instructions may cause the programmable control device to set the audio volume level at the target volume level. In yet another embodiment, the invention provides a computer system including a processor, an audio source adapted to generate audio signals, and a program storage device. A routine is stored on the program storage device that includes instructions embodying a method to limit an audio volume level of the computer system.

DETAILED DESCRIPTION

Figure 1:
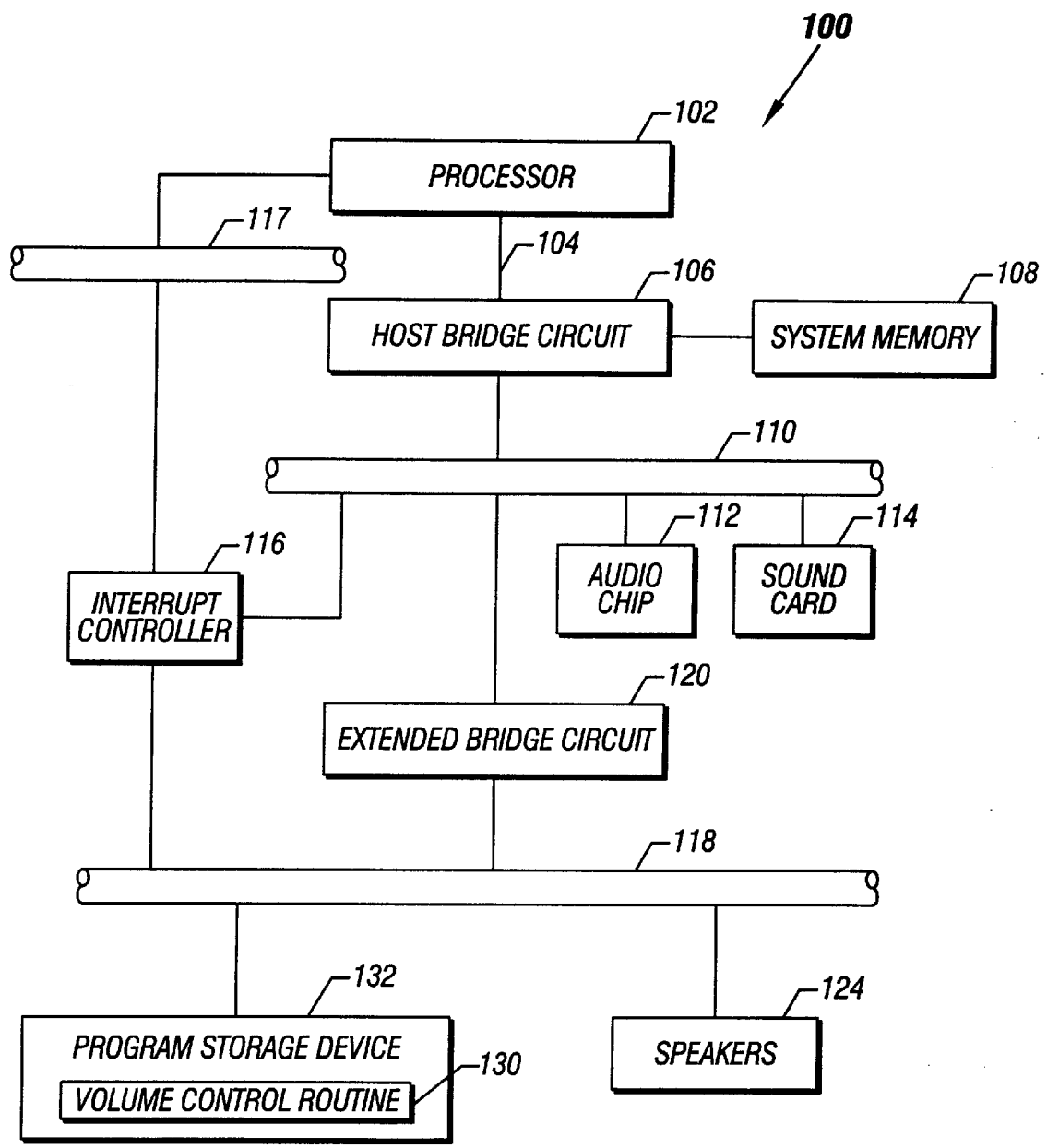
FIG. 1 shows an illustrative computer system having a volume control routine in accordance with one embodiment of the invention.

Referring to FIG. 1, an illustrative computer system 100 may include a processor 102 that may be any programmable control device such as a general or special purpose microprocessor, including multiple microprocessors. The processor 102 may be coupled to a host bridge circuit 106 by a processor bus 104. The host bridge circuit 106 may enable the processor 102 to communicate with system memory 108, which may be any type of random access memory (RAM). The processor 102 may also be coupled to a primary bus 110 through the host bridge circuit 106. An illustrative host bridge circuit 106 is the 82443BX Host-to-PCI bridge device from Intel Corporation. An illustrative primary bus 110 conforms to the Peripheral Component Interconnect (PCI) specification and serves as a communication link between various components of the system 100 and the processor 102. Also connected to the primary bus 110, may be an audio chip 112 to generate and control audio output from the system 100 and a sound card 114 to provide audio signal buffering and amplification. An illustrative audio chip is the CT5880 digital controller by Creative Technology, Ltd.

The system 100 may also include a secondary bus 118, such as an Industry Standard Architecture (ISA) bus, coupled to the primary bus 110 through a extended bridge circuit 120. An illustrative secondary bus may conform to specifications such as Industry Standard Architecture (ISA), Extended Industry Standard Architecture (EISA), and Low Pin Count (LPC). An illustrative extended bridge circuit 120 is the 82371AB PIIX4 IDE controller from Intel Corporation. The secondary bus 118 may facilitate communication between various input/output (I/O) devices, such as parallel and serial ports, and other aspects of the system 100. Speakers 124 may be connected to the system 100 through an audio line to emit sounds based on audio signals generated by the audio chip 112 and amplified by the sound card 114. Alternatively, the audio chip 112 may drive the speakers 124 directly. An interrupt controller 116, such as the 820931 Input/Output Advanced Programmable Interrupt Controller (IOAPIC) by Intel Corporation, may accept interrupt requests from various devices, such as the audio chip 112, through interrupt request lines of the primary and secondary buses 110 and 118. The interrupt controller may deliver interrupt requests to the processor 102 through an Advanced Programmable Interrupt Controller (APIC) bus 117. In some embodiments, the audio chip 112 may generate an interrupt request to invoke a volume control routine 130.

The volume control routine 130 may limit the audio volume level based on a maximum volume setting supplied by a user. The volume control routine 130 may be stored on a program storage device 132 that is coupled to the secondary bus 118. The program storage device 132 may be any non-volatile memory store such as non-volatile random access memory (NVRAM) or read only memory (ROM). Additionally, the volume control routine 130 may be stored as an executable file on a mass storage device (not shown) of the system 100 or on a floppy disk.

In accordance with one embodiment of the invention, a maximum volume level for the computer system 100 may be supplied by a user, such as a parent. The user may enter a maximum volume level through interaction with a software routine in order to limit the volume of audio output. For example, if the system 100 utilizes a text-based operating system such as MS-DOS® from Microsoft Corporation, the user may enter a maximum volume level through a text command. Alternatively, if a windowing environment is provided as in a WINDOWS® 95 or 98, or WINDOWS NT® operating system by Microsoft Corporation, a user may access volume controls from a volume dialog window. The volume dialog window may provide graphical volume controls, including a slider, to adjust the volume level by using a mouse or other pointer device. The volume dialog window may also have a maximum volume setting which is password protected.

In accordance with one embodiment, a user may be required to enter a password (comprising alphanumeric characters, for example) to modify the maximum volume setting. Any conventional password authentication algorithm may be used to verify that a user has entered a correct password. The maximum volume setting may be any indication of a maximum volume level, such as 25 or 50 percent of the volume capacity of the system 100. Alternatively, the maximum volume setting may be expressed as a discrete value (e.g., 70 decibels) or in any other appropriate unit of measurement. A user may set a specific value as the maximum volume setting by entering a value in a text field, selecting a value from a list, or by using a graphical control, such as a slider. An indication of the maximum volume setting may be stored in a read only and/or hidden data file on the system 100, or for added security, may be stored in an operating system registry file or in NVRAM. The operating system registry is a central database of configuration information for operating system and application programs. An illustrative operating system registry is the WINDOWS® Registry which is included in operating systems developed by Microsoft Corporation.

Once a maximum volume level has been established, the setting remains locked at that value until a user again enters a correct password and modifies the setting. With the maximum volume level set/locked, users are free to utilize standard system volume controls to lower the overall volume level or to raise the volume level for the computer system 100 up to the maximum volume setting. In order to raise the volume level of the system 100 above the maximum volume setting, a user is prompted to enter the password used to lock the maximum volume level.

In the event that a user, such as a parent, forgets the password, the maximum volume setting needs to be reset to a default value. The default value may be 100 percent of the audio volume capacity of the system 100, for example. If the maximum volume setting is stored in a hidden and/or read only data file, then the file may be deleted to reset to the default value. In an embodiment where the maximum volume setting is stored in an operating system registry file, a user may delete that entry in the registry corresponding to the maximum volume level. If, however, the maximum volume setting is stored in NVRAM, a user may utilize a system's setup routine to restore the maximum volume setting to the default value. Setup routines may, for example, be accessed during computer system startup operations.

Figure 2:
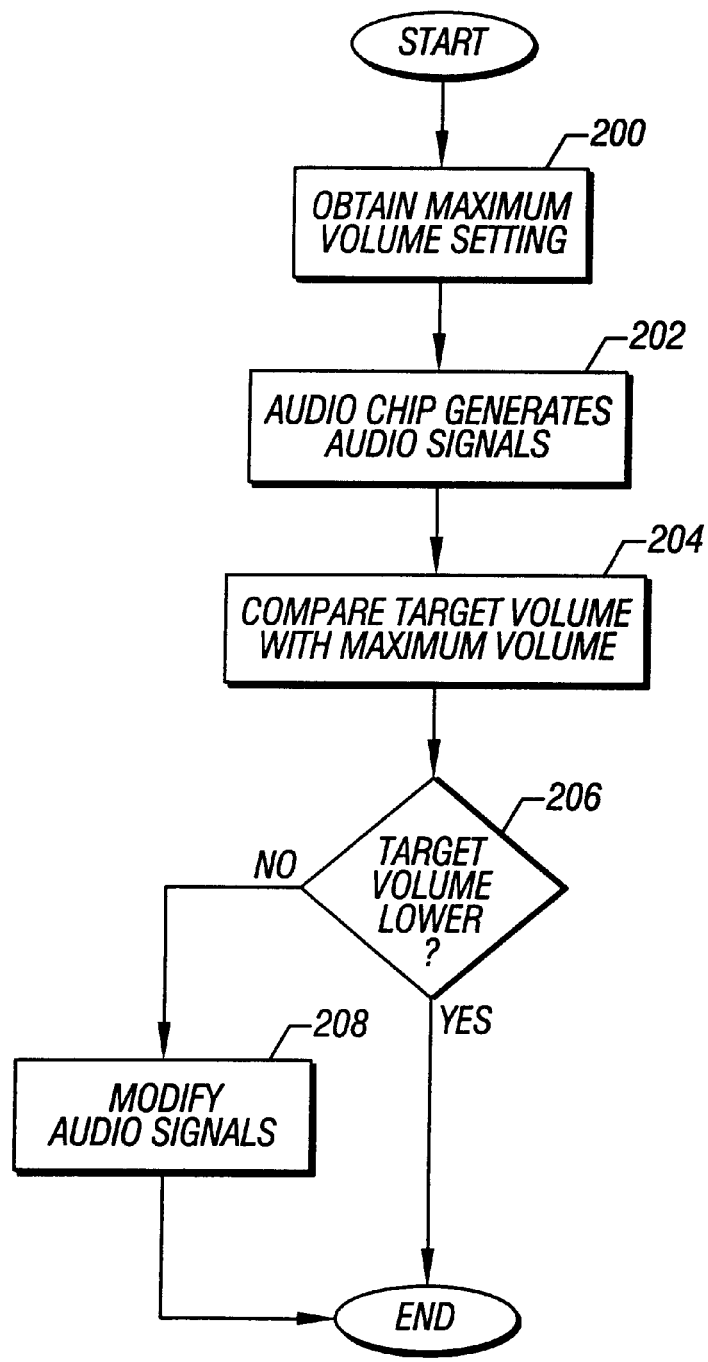
FIG. 2 shows a flow diagram for a volume control routine in accordance with another embodiment of the invention.

When the maximum volume setting is changed, a software interrupt may be generated which invokes the volume control routine 130. Referring to FIG. 2, the routine 130 may perform operations necessary to ensure that once a maximum volume level is set, audio output from the system 100 does not exceed the established maximum volume level. At block 200, the volume control routine 130 obtains the maximum volume setting described above by retrieving the setting from its stored location. The audio chip 112 may generate audio signals to be emitted by the speakers at a target volume level, shown in block 202. The target volume level corresponds to the overall volume level of the system which may be controlled by any user, as opposed to the password protected maximum volume setting. At block 204, the routine 130 compares the target volume to the maximum volume setting to determine if a modification of the audio signals is necessary. If the target volume level is lower than or the same as the maximum volume setting at diamond 206, no modification of the audio signals is necessary. However, if the target volume level is greater than the maximum volume setting at diamond 206, routine 130 may modify the audio signals such that the audio output is emitted at the maximum volume setting, as shown in block 208.

In one embodiment, the volume control routine 130 may be implemented as a basic input/output system (BIOS) routine that is stored in BIOS read only memory (ROM). A hardware interrupt may be generated periodically by the audio chip 112 in order to invoke the routine 130. The audio chip 112 may issue an interrupt request to the interrupt controller 116 any time that a user modifies the overall system volume. The interrupt controller 116 may deliver the request to the processor 102, which may respond by accessing an interrupt vector table to locate a beginning address for the routine 130. The processor AA02 executes the volume control routine 130 to determine if audio signals generated by the audio chip AA12 need to be modified in order to correspond to the maximum volume setting. In one embodiment, the volume control routine 130 may be invoked during power on self test (POST) operations wherein the maximum volume setting is retrieved. In order to modify the audio signals, the routine 130 may issue application programming interface (API) calls to the audio chip 112. Alternatively, the volume control routine 130 may be a background process that periodically polls audio signals generated by the audio chip 112 rather than being activated by an interrupt.

In accordance with another embodiment of the invention, the volume control routine 130 may be implemented as an operating system service routine. In this embodiment, the routine 130 may be executed initially when the BIOS loads an operating system into system memory 108. Thereafter when the overall system volume level is modified, an interrupt is generated in the same manner as described above to invoke the volume control routine 130. Alternatively, the routine 130 may periodically poll audio signals as a background process of the operating system to determine if the signals must be modified to correspond to the maximum volume setting. Additionally, the routine 130 may access and modify audio signal data by calling API operations of the audio chip 112.

In yet another embodiment, the audio chip 112 may monitor the audio signals it generates to determine if the target volume exceeds the maximum volume setting. In this embodiment, the maximum volume setting may initially be obtained by the audio chip 112 during POST operations performed by the BIOS. Thereafter, the audio chip 112 may obtain the maximum volume setting by generating a hardware interrupt when the overall system volume level is modified.

Computer systems in accordance with the invention benefit users in many ways. One benefit the invention provides is a technique for limiting a computer systems' audio volume level. Another benefit of the invention is that a computer system in accordance with the invention provides flexibility by utilizing a software program to set, modify, and password protect a maximum volume level rather than a physical mechanism which requires additional mechanical or electronic parts in speakers. Yet another benefit is that the invention allows a user to raise or lower overall system volume level as long the chosen level remains at or below the maximum volume level.

While the invention has been disclosed with respect to a limited number of embodiments, numerous modifications and variations will be appreciated by those skilled in the art. It is intended, therefore, that the following claims cover all such modifications and variations that may fall within the true spirit and scope of the invention.

What is claimed is:

1. A method to limit an audio volume level for a computer system comprising:

without first changing the audio volume level to change a first maximum volume level, obtaining a predetermined value representing a second maximum volume level, the predetermined value being supplied by a user;

in response to the predetermined value and a password from the user, modifying the first maximum volume level to establish the second maximum volume level;

receiving a signal indicating a target volume level;

setting the audio volume level at the second maximum volume level if the target volume level is above the second maximum volume level; and if the target volume is below the second maximum volume level, setting the audio volume level at the target volume level.

2. The method of claim 1, wherein the act of obtaining a predetermined value comprises retrieving a value from non-volatile random access memory.

3. The method of claim 1, wherein the act of obtaining a predetermined value comprises retrieving a value from a stored data file.

4. The method of claim 1, wherein the act of receiving a signal comprises obtaining a signal from an audio chip, the signal indicating a target volume level.

5. A computer system comprising:

a processor;

an audio source coupled to the processor, the audio source adapted to generate audio signals;

a program storage device coupled to the processor; and a routine stored on the program storage device, the routine adapted to cause the processor to:

without first changing an audio volume level of the audio source to change a first maximum volume level, obtain a value indicating a second maximum volume level, the value being supplied by a user;

in response to the predetermined value and a password from the user, modify the first maximum volume level to establish the second maximum volume level;

receive a signal indicating a target volume level; and set an audio volume level of the audio source at the second maximum volume level if the target volume level is above the second maximum volume level, otherwise set the audio volume level at the target volume level.

6. The computer system of claim 5, wherein the audio source comprises a digital audio chip to drive a speaker.

7. The computer system of claim 5, wherein the audio source comprises a digital audio chip which generates audio signals to be amplified by an audio card in order to drive a speaker.

8. The computer system of claim 5, wherein the program storage device comprises non-volatile random access memory.

9. The computer system of claim 1, wherein the program storage device comprises basic input-output system read only memory.

10. The computer system of claim 1, wherein the program storage device comprises a floppy disk.

* * * * *

UNITED STATES PATENT AND TRADEMARK OFFICE
CERTIFICATE OF CORRECTION

PATENT NO.    : 6,891,955 B1
DATED         : May 10, 2005
INVENTOR(S)   : Sean W. March, Patrick N. Sollee and David W. Mcknight It is certified that error appears in the above-identified patent and that said Letters Patent is hereby corrected as shown below:

Column 6,
Lines 29 and 32, "claim 1" should be -- claim 5 --.

Signed and Sealed this

Twenty-sixth Day of July, 2005

JON W. DUDAS
*Director of the United States Patent and Trademark Office*